United States Patent
Muniyappa et al.

(10) Patent No.: US 7,551,006 B2
(45) Date of Patent: Jun. 23, 2009

(54) LOW VOLTAGE DIFFERENTIAL SIGNALLING DRIVER

(75) Inventors: Vishwanath Muniyappa, Bangalore (IN); Sankarareddy S Kommareddi, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/867,068

(22) Filed: Oct. 4, 2007

(65) Prior Publication Data

US 2009/0091357 A1    Apr. 9, 2009

(51) Int. Cl.
*H03B 1/00* (2006.01)

(52) U.S. Cl. .................................. 327/108; 327/112

(58) Field of Classification Search .............. None
See application file for complete search history.

(56) References Cited

U.S. PATENT DOCUMENTS

| | | | |
|---|---|---|---|
| 5,977,796 A * | 11/1999 | Gabara | 326/86 |
| 6,552,581 B1 * | 4/2003 | Gabara | 327/108 |
| 6,900,663 B1 * | 5/2005 | Roper et al. | 326/83 |
| 6,975,141 B2 * | 12/2005 | Mueller et al. | 326/83 |
| 7,034,574 B1 * | 4/2006 | Li | 326/83 |
| 7,154,318 B2 * | 12/2006 | Sharma et al. | 327/206 |
| 7,183,805 B2 * | 2/2007 | Wang et al. | 326/86 |
| 7,236,018 B1 * | 6/2007 | Wang et al. | 327/108 |
| 7,330,056 B1 * | 2/2008 | Lu | 327/108 |
| 2007/0139086 A1 * | 6/2007 | Liu | 327/108 |

* cited by examiner

*Primary Examiner*—Cassandra Cox
(74) *Attorney, Agent, or Firm*—Eric Wb Dias; Rainieri G. Ventura

(57) ABSTRACT

A low voltage differential signal (LVDS) driver comprising a cascade current source circuit coupled to a positive voltage supply configured to supply a current, a cascade current sink circuit maintained at a ground voltage configured to receive the current; the cascade current source circuit being coupled to the cascade current sink circuit by a current switching circuit being provided by a positive voltage supply from the cascade current source circuit and with complementary logic signals, the current switching circuit configured to provide a constant differential output voltage while in operation. Other embodiments are also disclosed.

19 Claims, 6 Drawing Sheets

LOW VOLTAGE DIFFERENTIAL SIGNALLING DRIVER

BACKGROUND OF THE INVENTION

1. Technical Field

The present invention relates to a circuit describing a low voltage differential signaling driver architecture, particularly to a low voltage differential signaling driver architecture using transmission gates as current switches.

2. Description of the Related Art

Recent developments in the areas of telecommunications, data communications, personal computers market etc., has seen an increasing demand for high speed processing is continuously increasing. In order to transmit data effectively and efficiently at high speeds and at the same time ensure consumption of low power, Low Voltage Differential Signaling (hereinafter referred to as LVDS) driver circuits have evolved, catering to a plethora of applications. LVDS drivers are used, for example, in Scalable Coherent Signal interfaces (SCI) for transmitting data via point-point connections quickly and efficiently. With SCI interfaces, much higher speeds are achieved than with conventional data buses. Typically, a LVDS driver can operate with data rates of 500 Mb/s per second per signal pair and above being fully compatible with IEEE Std 1596.3-1996 for general-purpose links and IEEE 1394a interfaces.

FIG. 1 shows the architecture of a conventional LVDS (Low Voltage Differential Signal) driver architecture. The LVDS driver may be used in the data transmission of a LCD (Liquid Crystal Display). Because the voltage amplitude of the LVDS driver is smaller, the transmission speed may be faster. As shown in FIG. 1, the LVDS driver architecture 11 includes current sources CS1 and CS2, a switch unit 111, a common mode feedback unit 112 and a transistor MNR (common mode resistance unit). The currents of the current sources CS1 and CS2 are defined as $I_1$ and $I_2$. The switch unit 111 includes transistors MP1, MP2, MN1 and MN2. The transistors MP1, MP2, MN1 and MN2 of the switch unit 111, which are controlled by input signals IN and INB, determine the current direction of the output current Iout. That is, when the input signal IN is a high logic level and the input signal INB is a low logic level, the transistors MP2 and MN1 are ON and the transistors MP1 and MN2 are OFF. Thus, the output current Iout is positive. At this time, a resistor R1 of a receiver 12 receives the positive signal. When the input signal IN is the low logic level and the input signal INB is the high logic level, the transistors MP2 and MN1 are OFF and the transistors MP1 and MN2 are ON. Thus, the output current Iout is negative. At this time, the resistor R1 of the receiver 12 receives the negative signal. The receiver 12 includes the resistor R1 and a receiving unit 121.

In addition, the LVDS driver 11 further includes a common mode feedback (CMFB) unit 112 and the transistor MNR, which serves as a resistor to adjust the common mode voltage for transmission data. If the resistance value of the transistor MNR is Rc, then the voltage Va at the node a is: Va=I*Rc, wherein I is the difference of the current between the current source CS1 and the current source CS2, i.e., $I=I_1-I_2$. If the resistance value of the impedance matched resistor R1 of the receiver 12 is 100 Ohms($\Omega$), then the common mode voltage for transmission data is (Va+$I_1$*100/2). In the architecture of FIG. 1, the current source CS1 plays an important role in the PSRR (Power Supply Rejection Ration). The ideal current source CS1 has a best PSRR. In other words, because the current source CS1 has the non-ideal characteristic, the power noise influences the common mode level for transmission data. The influence can be induced by the parasitic capacitance and the channel length modulation (Vds*$\lambda$). From the viewpoint of the influence of the channel length modulation, the current variation $\Delta I_1$ of the current source CS1 is in direct proportion to the power voltage variation (noise) $\Delta$VDD, i.e., $\Delta I_1 = \Delta VDD*K1$.

Similarly, owing to the influence of the channel length modulation, $\Delta$Va is in direct proportion to $\Delta I_1$, so $\Delta$Va is also in direct proportion to $\Delta$VDD, i.e., $\Delta Va=\Delta VDD*K2$. Thus, the voltage Va at the node a is influenced by the power voltage VDD such that the common mode level is also influenced by the power voltage VDD.

Of course, some prior arts may be adopted to improve the characteristic of the current source CS1. For example, a cascode current source or a current source with a longer channel may be used. However, the voltage headroom of the cascode current source is restricted in the deep submicron technology, while using the current source with a longer channel requires a larger chip area and includes some limitations. Of course, the common mode feedback unit can correct the influence of the power noise, but the correction cannot be made in real time and is restricted by the bandwidth of the common mode feedback unit.

SUMMARY

It is therefore an object of the invention to provide a LVDS (Low Voltage Differential Signal) driver with a switching circuit consisting of transmission gates to provide a constant differential output.

Disclosed is a low voltage differential signal (LVDS) driver consisting to a cascade current source circuit coupled to a positive voltage supply configured to supply a current, a cascade current sink circuit maintained at a ground voltage configured to receive the current; the cascade current source circuit being coupled to the cascade current sink circuit by a current switching circuit being provided by a positive voltage supply from the cascade current source circuit and with complementary logic signals, wherein the current switching circuit configured to provide a constant differential output voltage.

The current switching circuit comprises a plurality of PMOS transistors and NMOS transistors coupled in pairs to form a plurality of transmission gates. Each of the transmission gates in the current switching circuit consists of a combination of a PMOS and a NMOS. Each transmission gate being configured to receive logic signal and a given pair of transmission gates receive complementary logic signals. For example in a pair of transmission gates, if the NMOS of a first transmission gate receives a logic signal 1, then the PMOS of the second transmission gate receives a logic signal 0. The differential output from current switching circuit is provided to the terminator unit is provided to a receiver over a communication medium.

Some advantageous of present invention include low area and low power consumption because of not using control logic and operational amplifier for controlling the current through the termination resistor, resulting in a lower cost of manufacturing and operating the LVDS. Further, low resistance of transmission gate makes the LVDS circuit to work at relatively higher speed.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following is intended to provide a detailed description of an example of the invention and should not be taken to be limiting of the invention itself. Rather, any number of variations may fall within the scope of the invention, which is defined in the claims following the description.

The present invention provides a low voltage differential signaling (LVDS) driver which requires less area on silicon, less power to operate and maintains a constant output differential voltage over variations in circuit fabrication processes, power supply voltages and operating temperature for wide range of common mode voltages. The LVDS driver in accordance with the present invention includes cascade current steering circuit, cascade current sourcing circuit and a current switching circuit which includes four transmission gate current switches. Based on the logic level of the input signals, the input current steering circuit steers the current from the sourcing circuit to generate positive differential output voltage across the termination resistor. Current sinking circuit sinks the current to the ground. On the other hand, the current steering circuit can be configured to steer the current to generate negative differential output voltage depending on the logic level of the input signal.

Figure 1:
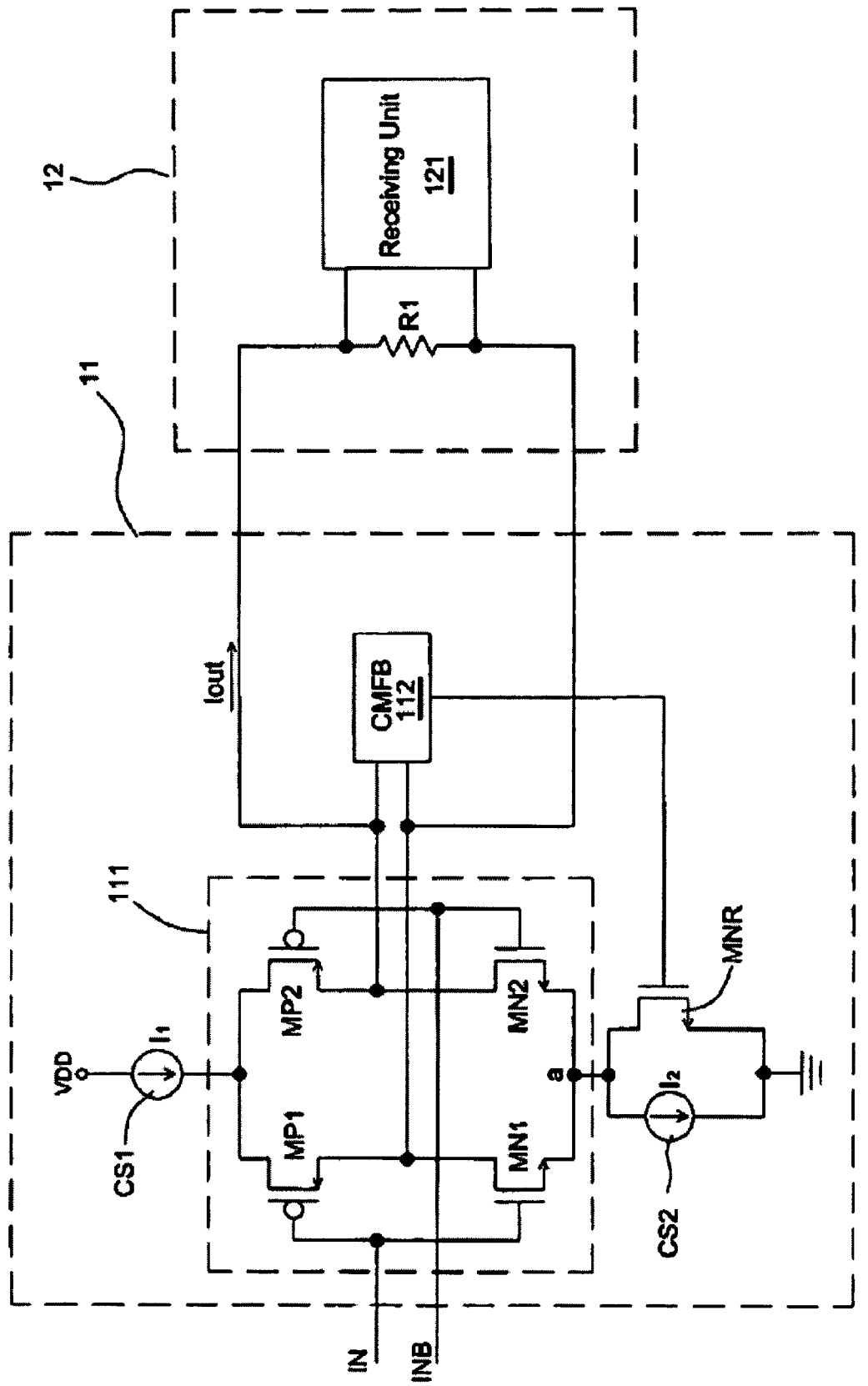
FIG. 1 shows the architecture of a conventional LVDS driver.
Figure 2:
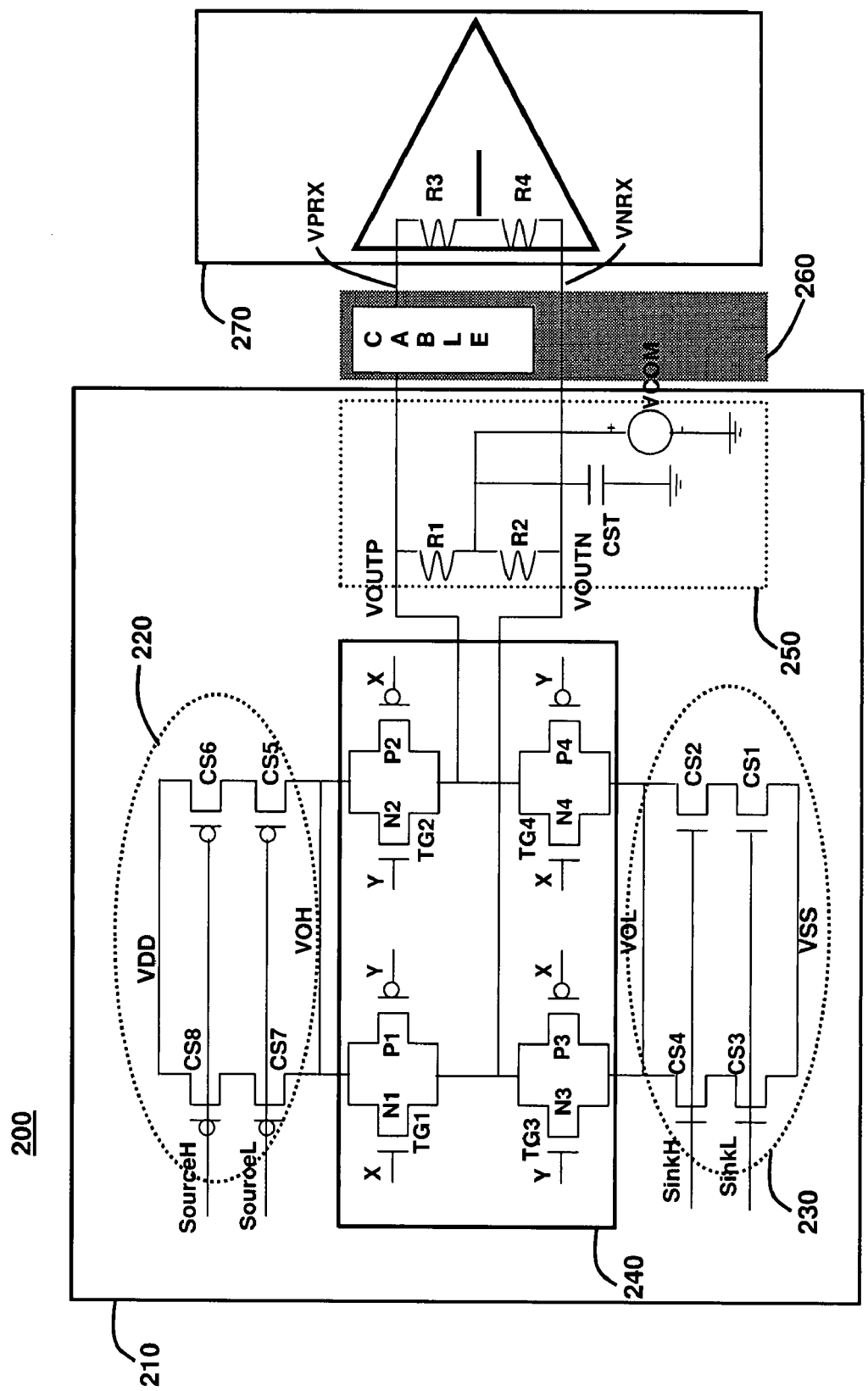
FIG. 2 shows the architecture of a circuit 200 containing a LVDS driver in accordance with the present invention.

FIG. 2 shows an exemplary embodiment of an architecture of a circuit 200 consisting of a transmission unit 210 having a LVDS driver 240 and a receiving unit 270. The circuit 200 will be explained in detail below. The circuit 200 contains mainly of a transmission unit 210 and a receiving unit 270, the transmission unit 210 being coupled to the receiving unit 270 by means of a cable 260. Advantageously, high conducting material such as Copper or any other materials such as metals and alloys, having a high conductivity are used as cables. In one embodiment, the transmission unit 210 and the receiving unit 270 by wired means using a copper cable 260 as discussed previously, by wireless means, with the transmission unit 210 and the receiving unit 270 being provided with suitable means to communicate wirelessly or by a combination of wired and wireless means thereof.

The transmission unit of FIG. 2 contains a cascade current source circuit 220, a current switching circuit 240, a cascade current sink circuit 230 and a termination unit 250. The termination unit 250 contains a termination block and an ideal VCOM, which together perform the role of an amplifier. The termination unit consists of two resistors R1 and R2 coupled between a positive voltage output VOUTP and a negative voltage output VOUTN of the current switching circuit 240. The output VOUTP and VOUTN from the current switching circuit 240 is provided as input to the termination unit 250. For example, in a preferred embodiment the resistors R1 and R2 can have a value of 50 Ω(ohms), thereby having a series resistance of 100Ω. A first end of a capacitor CST is coupled to a node between the two resistors R1 and R2, and the other end of the capacitor being maintained at a ground potential. Further a positive end of a common mode voltage source (VCOM) is coupled to a node between the resistors R1 and R2 and the negative end of the VCOM is maintained at a ground potential. In a preferred embodiment, the capacitor CST has a value of 0.3 µF (micro Farad). The output from the termination unit 250, VPRX and VNRX is provided to the receiving unit 270 by means of a cable 260 coupling the transmission unit 210 and the receiving unit 270.

The receiving unit 270 typically comprises a receiver, which can receive a the output from the termination unit 250 of the transmission unit 210 positive voltage VPRX and a negative voltage VNRX between two termination resistors R3 and R4 coupled in series. In a preferred embodiment, the termination resistors R3 and R4 have a value of 50Ω, having a series resistance of 100Ω.

The LVDS driver of FIG. 2 consists of a cascade current source circuit 220, a cascade current sink circuit 230, and a current switching circuit 240. The cascade current source circuit 220 consists of a plurality of P-channel MOSFETs (PMOS) CS5, CS6, CS7 and CS8. A PMOS CS6 and CS8 are coupled to VDD, where VDD is the positive supply voltage. Typically, drains of the PMOS are coupled to the positive voltage supply VDD. For example, in one embodiment for NMOS logic, VDD is typically referred to as "drain" voltage and VSS is referred to as a "source" voltage. The gates of the PMOS CS6 and CS8 in the cascade current source circuit 220 are provided with a bias voltage SourceH, while the gates of the PMOS CS5 and CS7 are provided with a bias voltage SourceL. The source of the PMOS CS5 and CS7 are provided with a voltage VOH. The cascade current source circuit 220 provides high output resistance, due to which the variations at the drains of the currents are minimal.

The cascade current sink circuit 230 a plurality of N-channel MOSFETs (NMOS) CS1, CS2, CS3 and CS4. The NMOS CS1 and CS3 are coupled to VSS, where VSS is the negative voltage, which preferably is maintained at a ground potential. Typically, source of the NMOS are coupled to the ground potential VSS. The gates of the NMOS CS2 and CS4 in the cascade current source circuit 220 are provided with a bias voltage SinkH, while the gates of the NMOS CS1 and CS3 are provided with a bias voltage SinkL. The drain of the NMOS CS2 and CS4 are provided with a voltage VOL. The cascade current sink circuit 230 provides high output resistance, due to which the variations at the drains of the currents are minimal.

The current source circuit 220 is coupled to the current sink circuit 230 via a current switching circuit 240. The current switching circuit 240 consists of a combination of four transmission gates TG1, TG2, TG3 and TG4. Each of the transmission gates TG1, TG2, TG3 and TG4 in the current switching circuit 240 consists of a combination of a NMOS and PMOS transistor. In the current switching circuit 240 in accordance with the present invention, the transmission gate TG1 consists of a NMOS N1 and a PMOS P1, the transmission gate TG2 consists of a NMOS N2 and a PMOS P2, the transmission gate TG3 consists of a NMOS N3 and a PMOS P4, and the transmission gate TG4 consists of a NMOS N4 and a PMOS P4. A digital signal (indicated as X or Y) is provided to the transmission gates as an input. The input signal X and Y are complementary logic signals, i.e., when X has a input value 1, Y has an input value 0.

For example, if X is 0101010101 then Y is 1010101010, i.e., if X=1 then Y will be 0, the transmission gate TG1 is in an ON state because N1 is in a ON state and P1 is an ON state. Similarly the transmission gate TG4 will be in an ON state because N4 is in a ON state and P4 is an ON state. When the transmission gates TG1 and TG4 are in an ON state, the transmission gates TG2 and TG3 will be in an OFF state. A positive voltage VOUTP is provided from the arm either connecting the transmission gates TG1 and TG3, and a negative voltage VOUTN is provided from the arm either connecting the transmission gates TG2 and TG4. In this instance, the positive voltage VOUTP is output from the transmission gate TG1 and the negative voltage VOUTN is output from the transmission gate TG4, is provided to the termination unit 250.

Based on the logic level of the input signals X and Y, the input current source circuit steers the current from the current source circuit 220 to generate positive differential output voltage across the termination resistor R1 and R2. The current sinking circuit 230 sinks the current to the ground VSS, and vice versa where depending on the input logic level the current source circuit steers the current to generate negative differential output voltage.

Transmission gate current switch combines the best of both devices by placing an NMOS in parallel with PMOS. It is therefore acceptable that the equivalent on-resistance (Rn∥Rp) of transmission gate has a constant value and low ON resistance. The speed of the circuit decides on the output impedance of LVDS structure, and it is a sum of transmission gate switch resistance and the low voltage differential load resistor and LVDS load capacitance. The sizing of all the FETs (MOS or transistor devices) in transmission gate same where NW1/NL1=NW2/NL2=NW3/NL3=NW4/NL4=PW1/PL1=PW2/PL2=PW3/PL3=PW4/PL4, where W is the width and L is the length of the MOS devices.

X and Y are complementary logic signals. when signal X is logic HIGH and signal Y is logic LOW, and the MOSFETs N1, P1, N4, and P4 are ON and MOSFETs N2, P2, N3, and P3 are OFF. Path from the VDD power supply to the VSS ground supply exists through the transmission gate current switch and 100Ω resistor (R1 and R2). Current from cascade current source circuit 220 will source the current through the MOSFETs N1 and P1 and cascade current sinking circuit will sink the current through the MOSFETs N4 and P4. This current across the 100Ω resistor (R1 and R2) will generate negative voltage.

When signal X is logic LOW and signal Y is logic HIGH, the MOSFETs N1, P1, N4, P4 are OFF and the MOSFETs N2, P2, N3, P3 are ON. Current from cascade current source circuit 220 will source the current through the MOSFETs N2, P2 and cascade current sinking circuit 230 sinks the current through the MOSFETs N3, P3. This current across the 100Ω resistor (R1 and R2) will generate positive voltage.

Figure 3:
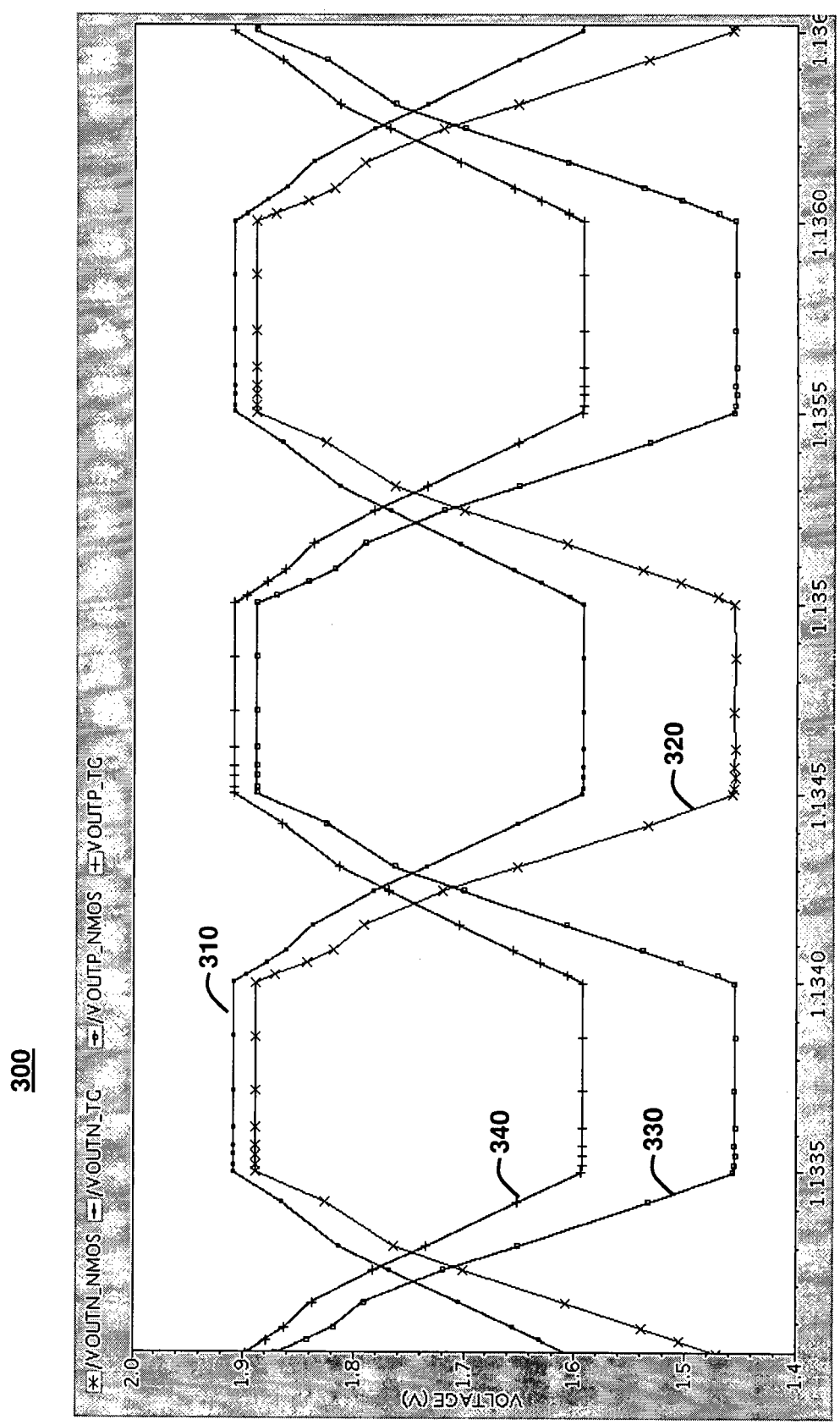
FIG. 3 shows a comparison of a waveform (320 and 330) generated by a LVDS driver of the prior art and a waveform (310 and 340) generated by the LVDS driver in accordance with the present invention.

FIG. 3 illustrates a comparison 300 between the output waveform (320 and 330) of a convention LVDS driver and the output waveform (310 and 340) of the LVDS driver architecture as described previously in FIG. 2 in accordance with the present invention. The Y-axis represents illustrates Voltage (in volts) and the X-axis represents time. The differential output voltage (VOD) i.e., the difference between the output waveforms 320 and 330 should not exceed 350 mv, but the difference will not be within the range for process, voltage, temperature and for all common mode voltages (VCOM).

Figure 4:
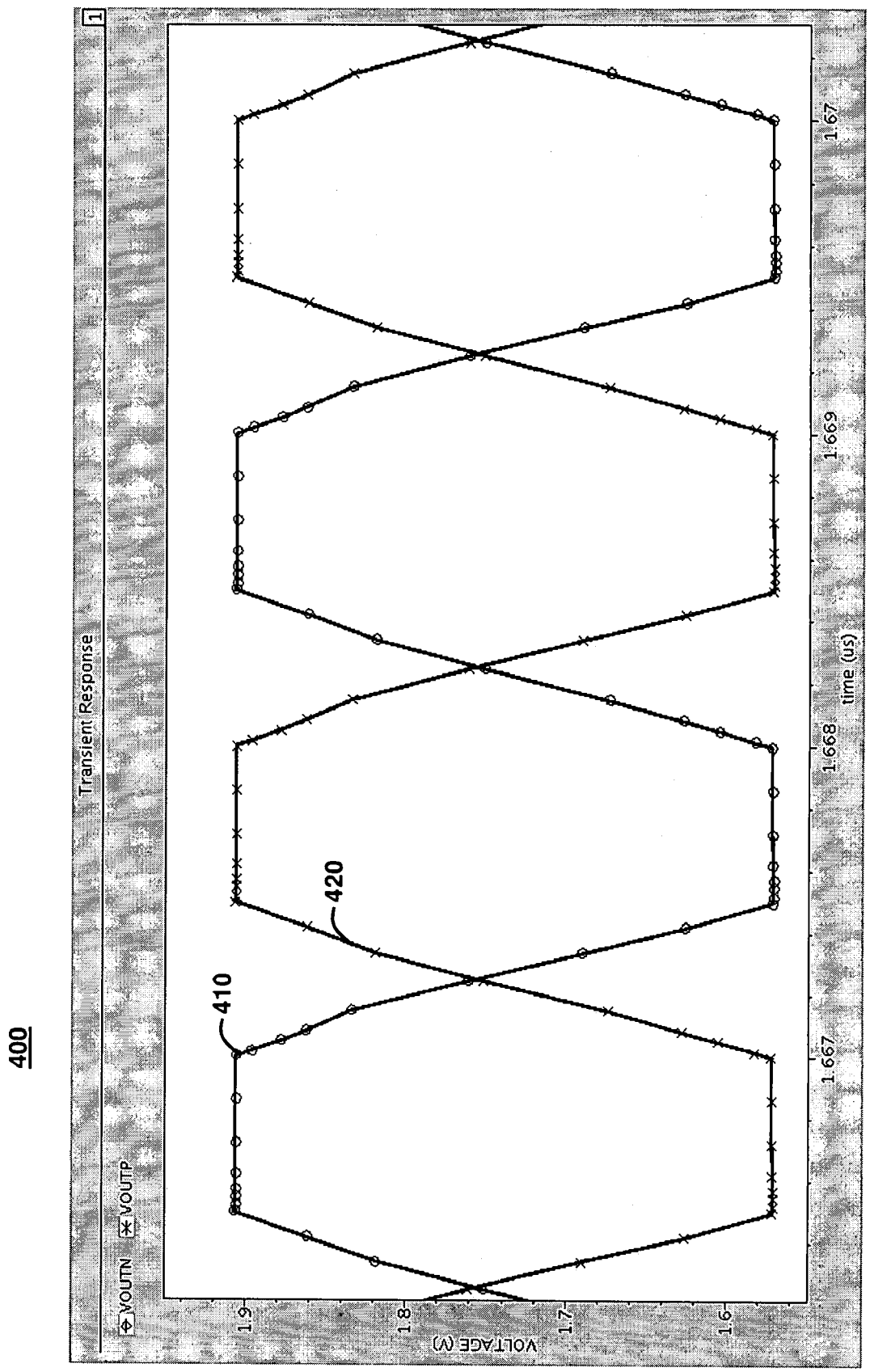
FIG. 4 shows an output swing of the LVDS driver of FIG. 2.

FIG. 4 illustrates the output swing 400 for the LVDS driver architecture as described previously in FIG. 2. In FIG. 4, X-axis represents time and Y-axis represents Voltage (in volts). The waveform 410 is equivalent to VOUTP and the waveform 420 is equivalent to VOUTN, as has been described previously with respect to FIG. 2. The waveforms are generated when the value of VCOM is about 1.8V. Referring back to FIG. 2, when the signal X=1, Y=0 and VCOM=1.8, TG1=ON, TG2=OFF, TG3=OFF and TG4=ON, and current from cascade current source 220 steers current to the 100% resistor to generate a positive voltage above 1.8V (350/2=175 mV), which is 175 mV above 1.8V and 175 mV below 1.8V for other output to generate negative output.

Figure 5:
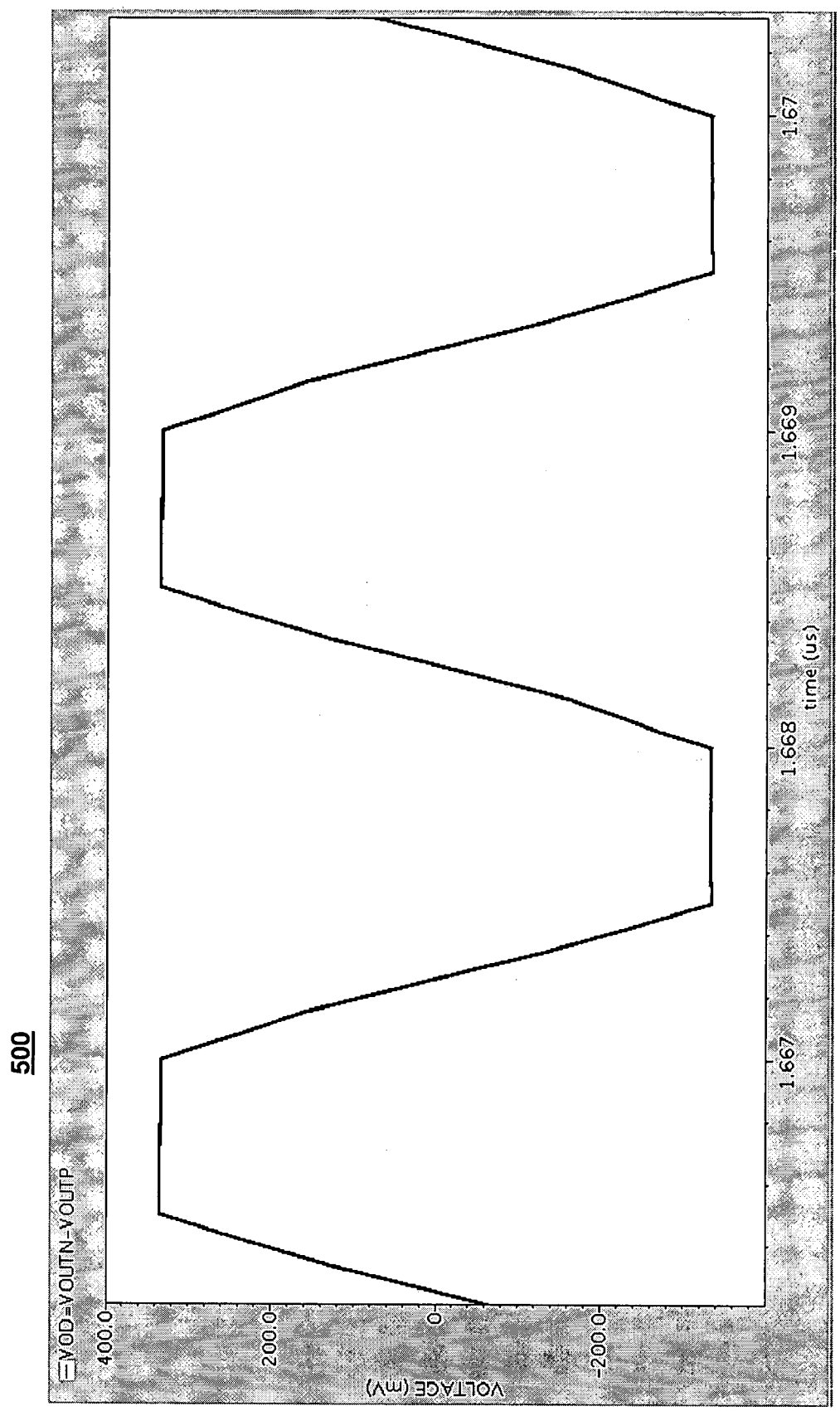
FIG. 5 shows the differential output voltage of the LVDS diver of FIG. 2.

FIG. 5 shows a Differential Output Voltage (VOD) 500 of the LVDS driver architecture that has been described previously in FIG. 2. In FIG. 5, X-axis represents time and Y-axis represents voltage in milliVolts (mV). The differential output voltage can be computed using the expression for VOD=VOUTN−VOUTP, where VOD should be within +/−350 mV for all VCOM in the range from 0.4V to 2.4V.

Figure 6:
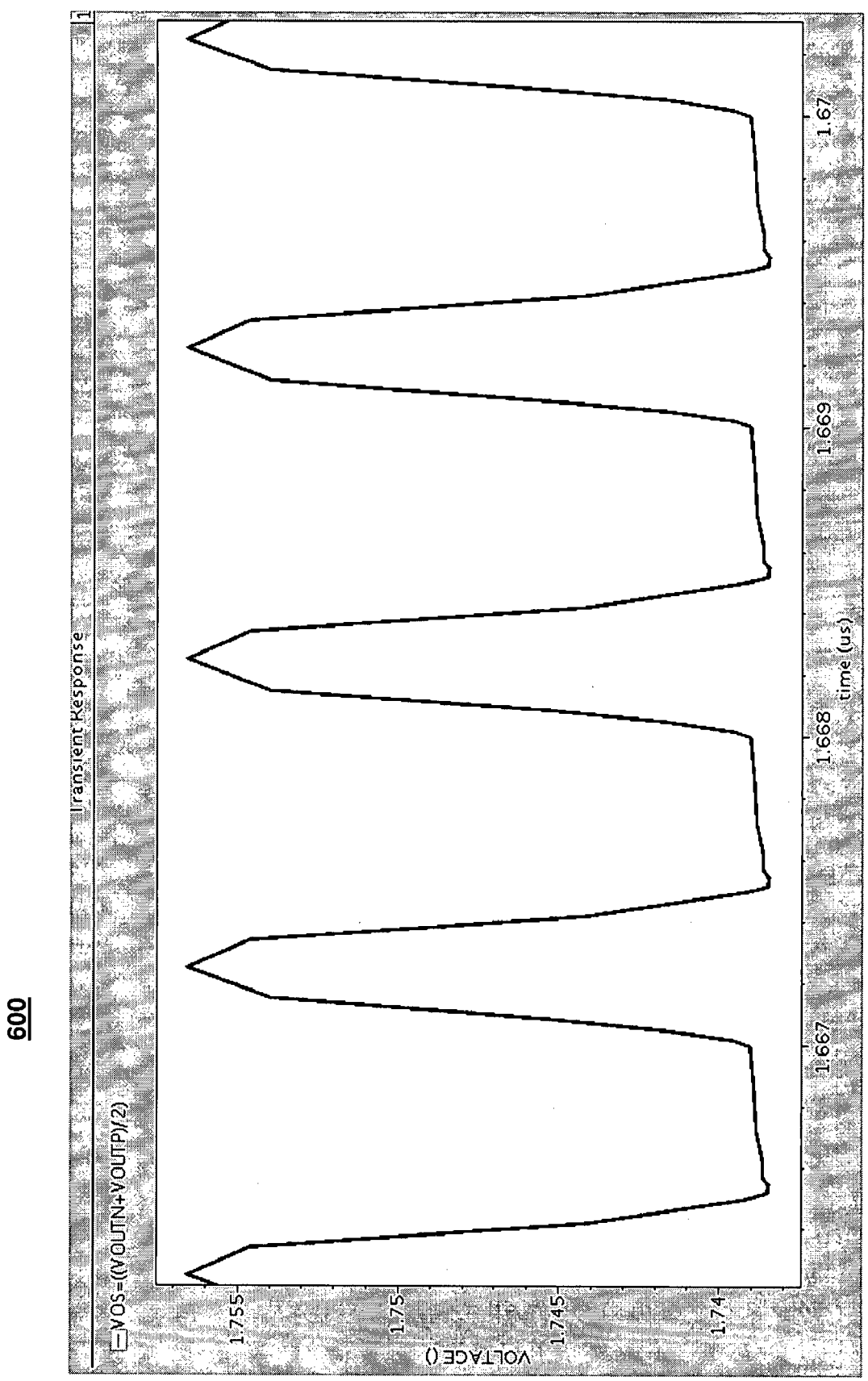
FIG. 6 shows a output offset voltage of the LVDS driver of FIG. 2.

FIG. 6 shows the output offset voltage 600, where the output offset voltage VOS can be computed using the expression VOS=[(VOUTN+VOUTP)/2]. In FIG. 5, the X-axis represents the time domain and the Y-axis represents the Voltage.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature. Therefore, it is desired that the embodiments described herein be considered in all respects as illustrative, not restrictive, and that reference be made to the appended claims for determining the scope of the invention.

While particular embodiments of the present invention have been shown and described, it will be obvious to those skilled in the art that, based upon the teachings herein, that changes and modifications may be made without departing from this invention and its broader aspects. Although the invention has been described with reference to the embodiments described above, it will be evident that other embodiments may be alternatively used to achieve the same object. It should be noted that the above-mentioned embodiments illustrate rather than limit the invention and that those skilled in the art will be able to design alternative embodiments without departing from the scope of the appended claims. In the claims, any reference signs should not limit the scope of the claim. The invention can be implemented by means of hardware comprising several distinct elements. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A low voltage differential signal (LVDS) driver comprising:
    a cascade current source circuit coupled to a positive voltage supply configured to supply a current;
        wherein the cascade current source circuit configured to provide a positive voltage supply comprises a first PMOS and a second PMOS configured to receive a high bias voltage and a third PMOS and a fourth PMOS configured to receive a low bias voltage;
        a cascade current sink circuit maintained at a ground voltage configured to receive the current;
        the cascade current source circuit being coupled to the cascade current sink circuit by a current switching circuit being provided by a positive voltage supply from the cascade current source circuit and with complementary logic signals, the current switching circuit configured to provide a constant differential output voltage while in operation.

2. The LVDS driver of claim 1, wherein the cascade current sink circuit configured to receive a current and maintained at the ground voltage comprises a first NMOS and a second NMOS configured to receive a high bias voltage and a third NMOS and a fourth NMOS configured to receive a low bias voltage.

3. The LVDS driver of claim 1, wherein the current switching circuit comprises a plurality of PMOSs and NMOSs coupled in pairs to form a plurality of transmission gates.

4. The LVDS driver of claims 3, wherein each transmission gate comprises a PMOS and an NMOS in combination.

5. The LVDS driver of claim 4, wherein in a first and a second transmission gates the NMOS receive a logic signal 1 and the PMOS receives a logic signal 0.

6. The LVDS driver of claim 4, wherein in the third and fourth transmission gates the PMOS receives a logic signal 1 and the NMOS receives a logic signal 0.

7. The LVDS driver of claim 1, wherein the differential output from the current switching circuit is provided to a terminator unit.

8. The LDVS circuit of claim 7, wherein the differential output from the terminator unit is provided to a receiver over a communication medium.

9. The LVDS of claim 8, wherein the communication medium is a cable.

10. A circuit comprising a low voltage differential signal (LVDS) driver comprising:
    a cascade current source circuit coupled to a positive voltage supply configured to supply a current;
        wherein the cascade current source circuit configured to provide a positive voltage supply comprises a first PMOS and a second PMOS configured to receive a high bias voltage and a third PMOS and a fourth PMOS configured to receive a low bias voltage;
        a cascade current sink circuit maintained at a ground voltage configured to receive the current;
        the cascade current source circuit being coupled to the cascade current sink circuit by a current switching circuit being provided by a positive voltage supply from the cascade current source circuit and with complementary logic signals, wherein the current switching circuit configured to provide a constant differential output voltage;
        the cascade current source circuit, the cascade current sink circuit and the current switching circuit along with a termination unit forming a transmission block and coupled to a receiver block by means of a cable.

11. The circuit of claim 10, wherein the cable comprises conducting metallic materials.

12. The circuit of claims 10, wherein the cascade current sink circuit configured to receive a current and maintained at the ground voltage comprises a first NMOS and a second NMOS configured to receive a high bias voltage and a third NMOS and a fourth NMOS configured to receive a low bias voltage.

13. The circuit of claims 10, wherein the current switching circuit comprises a plurality of PMOSs and NMOSs coupled in pairs to form a plurality of transmission gates, and each transmission gate comprising a combination of a PMOS and an NMOS.

14. The circuit of claims 13, wherein the current switching circuit comprises four transmission gates the first transmission gate a NMOS receive a logic signal 1, the second transmission gate a PMOS receives a logic signal 0, the third transmission gate a PMOS receives a logic signal 1 and the fourth transmission gate a NMOS receives a logic signal 0.

15. The circuit of claims 10, wherein the differential output from the current switching circuit is provided to a terminator unit, and the differential output from the terminator unit is provided to a receiver over a communication medium.

16. A circuit comprising:
    means for generating a current supply, wherein the means for generating the current supply comprises a cascade current source circuit coupled to a positive voltage supply;
        wherein the cascade current source circuit configured to provide a positive voltage supply comprises a first PMOS and a second PMOS configured to receive a high bias voltage and a third PMOS and a fourth PMOS configured to receive a low bias voltage and the cascade current sink circuit configured to receive a current and maintained at the ground voltage comprises a first NMOS and a second NMOS configured to receive a high bias voltage and a third NMOS and a fourth NMOS configured to receive a low bias voltage;
    means for receiving a current, wherein the means for receiving the current comprises a cascade current sink circuit maintained at a ground voltage;
    means for providing a constant differential output voltage, wherein the means comprises a current switching circuit coupled to the cascade current source circuit and to the cascade current sink circuit by a current switching circuit being provided by a positive voltage supply from the cascade current source circuit and with complementary logic signals.

17. The circuit of claims 16, wherein the current switching circuit comprises a plurality of PMOSs and NMOSs coupled in pairs to form a plurality of transmission gates, and each transmission gate comprising a combination of a PMOS and an NMOS; and the current switching circuit comprising four transmission gates the first transmission gate a NMOS receive a logic signal 1, the second transmission gate a PMOS receives a logic signal 0, the third transmission gate a PMOS receives a logic signal 1 and the fourth transmission gate a NMOS receives a logic signal 0.

18. The circuit of claims 16, further comprising:
    means for transmitting the constant differential output voltage;
    means for communicating the differential output voltage;
    means for receiving the differential output voltage.

19. A low voltage differential signal (LVDS) driver comprising:

a cascade current source circuit coupled to a positive voltage supply configured to supply a current;

wherein the cascade current sink circuit configured to receive a current and maintained at the ground voltage comprises a first NMOS and a second NMOS configured to receive a high bias voltage and a third NMOS and a fourth NMOS configured to receive a low bias voltage;

a cascade current sink circuit maintained at a ground voltage configured to receive the current;

the cascade current source circuit being coupled to the cascade current sink circuit by a current switching circuit being provided by a positive voltage supply from the cascade current source circuit and with complementary logic signals, the current switching circuit configured to provide a constant differential output voltage while in operation.

* * * * *